(12) United States Patent
Nordeng et al.

(10) Patent No.: US 7,218,171 B1
(45) Date of Patent: May 15, 2007

(54) VOLTAGE OFFSET MEASUREMENT FOR CALIBRATION OF AN INTEGRATED CIRCUIT AMPLIFIER

(75) Inventors: Arnold Erling Nordeng, Colorado Springs, CO (US); Hengsheng Liu, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 140 days.

(21) Appl. No.: 11/052,104

(22) Filed: Feb. 8, 2005

(51) Int. Cl.
  *H03F 1/02* (2006.01)
(52) U.S. Cl. .............................................. 330/9
(58) Field of Classification Search ................ 330/9; 327/124, 307
See application file for complete search history.

(56) References Cited

U.S. PATENT DOCUMENTS 6,426,674 B1 * 7/2002 Davidescu ................. 330/9
6,459,335 B1 * 10/2002 Darmawaskita et al. ....... 330/9

OTHER PUBLICATIONS

George Erdi "A Precision Trim Technique for Monolithic Analog Circuits" *IEEE Journal of Solid-State Circuits*, vol. SC-10, No. 6 Dec. 1975.

* cited by examiner

*Primary Examiner*—Robert Pascal
*Assistant Examiner*—Hieu Nguyen
(74) *Attorney, Agent, or Firm*—McDermott Will & Emery LLP

(57) ABSTRACT

Voltage offset of an integrated circuit amplifier is accurately determined for calibration of the device. Circuit connections are established between the integrated circuit and an external device, such as an IC handler. Internal noise gain resistors formed within the integrated circuit are connected by internal switches to the amplifier and the output voltage is measured so that a value of a voltage offset of the amplifier while the noise gain resistors are connected can be calculated. The use of internal noise gain resistors produces a voltage offset component of the output voltage that is significantly greater in magnitude than effects of thermocouple voltages generated by circuit junction connections.

17 Claims, 6 Drawing Sheets

VOLTAGE OFFSET MEASUREMENT FOR CALIBRATION OF AN INTEGRATED CIRCUIT AMPLIFIER

TECHNICAL FIELD

The present disclosure relates to the calibration of integrated circuit amplifiers, more particularly to the accurate measurement of voltage offset for very low offset operational amplifiers to obtain improved calibration accuracy.

BACKGROUND

Precision integrated circuit amplifiers require a calibration process to null out inherent voltage offset for proper operation. Several common methods of voltage offset calibration can be performed by high volume test systems. Typically, a manual adjustment to the amplifier's input stage is performed and ultimately made permanent. A known predictable imbalance is introduced to the differential input stage, which counteracts the effect of voltage offset error $V_{OS}$. One method of amplifier voltage offset adjustment is described by George Erdi, "A Precision Trim Technique for Monolithic Analog Circuits," IEEE Journal of Solid-State Circuits, Vol. SC-10, No. 6, December 1975. Selective shorting of Zener diodes adjusts for imbalances in the differential resistive load seen by the input stage differential pair. Additional circuitry must be included in the input stage which, when activated, will produce a known predictable imbalance to counteract and cancel the effect of $V_{OS}$. Another method of introducing known predictable input stage imbalance is to purposely skew the W/L ratio of the differential input pair by means of CMOS switching the W/L ratio. In yet another known method, one can access an on-the-same-die integrated circuit digital to analog converter (DAC) to steer current and control a degree of DC current imbalance to the differential input pair's load. Since opamp input differential pairs steer the tail (bias) current to a differential load, a digital word in the DAC can counter balance the effect of $V_{OS}$.

Common test environments for measuring voltage offset of an operational amplifier embedded in an integrated circuit generally involves an integrated circuit handler with external relays to configure the amplifier for noise gains in excess of 100. Very low offset and offset drift amplifiers, for example less than 1 mv of voltage offset, present difficulties in obtaining an accurate measurement of $V_{OS}$ due to thermoelectric voltage error sources in high volume test environments. Thermocouple voltages, produced by the known Seebeck effect, exist wherever two different conductive materials are joined in series, and two junctions of the two conductive materials are at different temperatures. As dissimilar materials exist throughout the testing system, thermocouple voltages are generated that would not be generated during subsequent normal operation of the amplifier with the testing system detached. Each dissimilar junction contributes a thermocouple emf which varies as a function of junction temperature, making it difficult to distinguish between the amplifier voltage offset and unrelated thermocouple potentials. The handler-IC junctions can be a source of voltage offset error that can be comparable in magnitude to the voltage offset that is desired to be calibrated out.

A simplified diagram of a typical testing arrangement, such as described above, is depicted in FIG. 1. Integrated package 10 includes an operational amplifier 12 having input bond wire and package interface and package interface junctions 14 and 16 and an output bond wire and package interface and package interface junction 18. The internal voltage offset of the operational amplifier is represented by a voltage $V_{OS}$ 20. Handler junctions 22 and 24 connect to the input bond wire and package interface and package interface junctions; handler junction 26 connects to the output bond wire and package interface junction. Test relays connect resistor 28, of value R, across the inverting and non-inverting input and resistor 30, of value KR, between the inverting input and output, form thermocouple junctions 32 and 34 respectively. Noise gain resistors 28 and 30 are utilized during testing to establish an amplifier gain for calibrating out offset voltage. The non-inverting amplifier input is connected to ground. Each of the voltages $V_{14}$–$V_{34}$ produced by the eight illustrated thermocouple junctions has been identified in the diagram. In the illustrated example, the actual voltage measured at $V_{OUT}$ is as follows:

$$V_{OUT} = (V_{16} + V_{24} - V_{14} - V_{22} + V_{OS}) \cdot (1+K) + V_{32} - K + V_{34} + (V_{18} + V_{26}) \cdot (1+K)/A_V$$

where $V_{OS}$ is the voltage offset to be measured and calibrated out, $A_v$ is the loop gain of the IC amplifier under test, and $V_i$ is the thermocouple voltage at the $i^{th}$ junction. Because both the amplifier voltage offset ($V_{OS}$), and the various thermal voltages are both gained up by the noise gain (1+K), it is impossible to distinguish the amplifier's offset voltage contribution by measuring the amplifier's output voltage when the magnitude of the offset is the same order of magnitude as the thermocouple voltages $V_i$.

The need thus exists for a method and implementation to accurately measure, characterize, and calibrate out voltage offset of precision integrated circuit amplifiers in which thermocouple voltages are significant.

SUMMARY OF THE DISCLOSURE

The subject matter described herein fulfills the above-described needs of the prior art at least in part by providing a method of measuring for calibration that utilizes noise gain resistance formed within the integrated circuit for testing. Circuit connections are established between the integrated circuit and an external device, such as an IC handler. Internal noise gain resistors formed within the integrated circuit are connected to the amplifier and the output voltage is measured so that a value of a voltage offset of the amplifier while the noise gain resistors are connected can be calculated. By using internal noise gain resistors, a voltage offset component of the output voltage that is greater in magnitude than the effects of voltages generated by circuit junction connections can be produced. $V_{OS}$ becomes the dominant contributor to $V_{OUT}$ and makes it possible to distinguish amplifier offset from the accompanying contact thermocouple voltages and then to proceed with adjusting the offset voltage. The resistors form a voltage divider circuit used only during a test mode to provide an output in the test mode that is proportional to a voltage offset of the amplifier.

Switches within the integrated circuit are activated to connect the noise gain resistors to any of a plurality of advantageous specific circuit configurations. In a preferred implementation, a first internal switch is activated to connect a resistance of a first value between inverting and non-inverting input nodes of an operational amplifier and a second internal switch is activated to connect resistance of a second value between the inverting input node and an output node of the amplifier. With the non-inverting input of the amplifier connected to ground, the voltage output is measured, either directly or from a junction node between the second noise gain resistor and the second switch. The voltage output measurement provides an indication of amplifier offset voltage that can then be nulled out in a calibration process. A further output voltage measurement can be made with the switches deactivated to remove the noise gain resistors from circuit and with a third internal switch activated to connect the inverting input node to the output node. The difference between the two voltage measurements can be calculated to provide a highly accurate voltage offset indication. As a variation of the above described two measurement procedure, output voltage can be sensed with the noise gain resistors connected while the non-inverting amplifier input node is alternatively connected to positive and negative voltage sources in lieu of connection to ground. Additional internal switches are used to provide these circuit connections. After calibration, additional measurements as described above can be made to determine whether the offset adjustment has met specified requirements. If no further adjustment is necessary, the adjustment can be made permanent, for example by programming a digital code, and then permanently deactivating the switches in circuit with the internal noise gain resistors, for example by a fuse blowing lockout mechanism.

Additional advantages will become readily apparent to those skilled in this art from the following detailed description, wherein only the preferred embodiments are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 1:
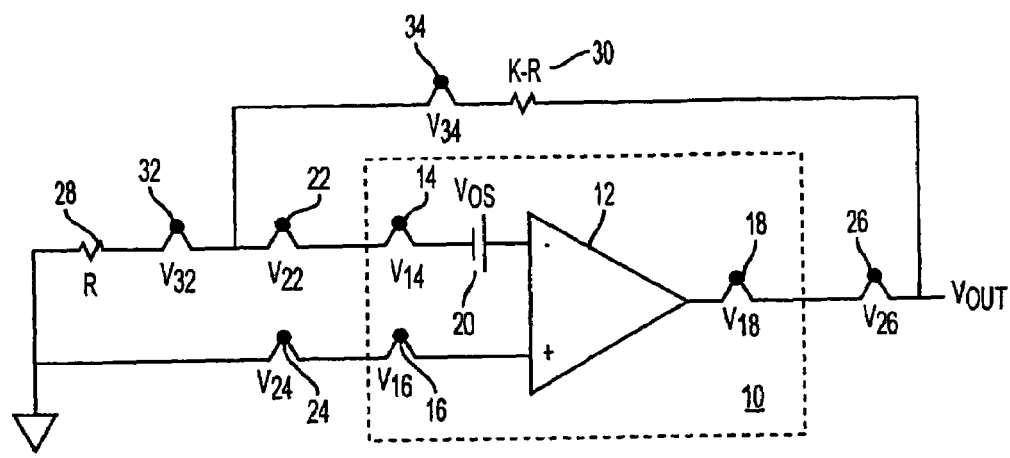
FIG. 1 is a simplified diagram of a conventional testing arrangement.
Figure 2:
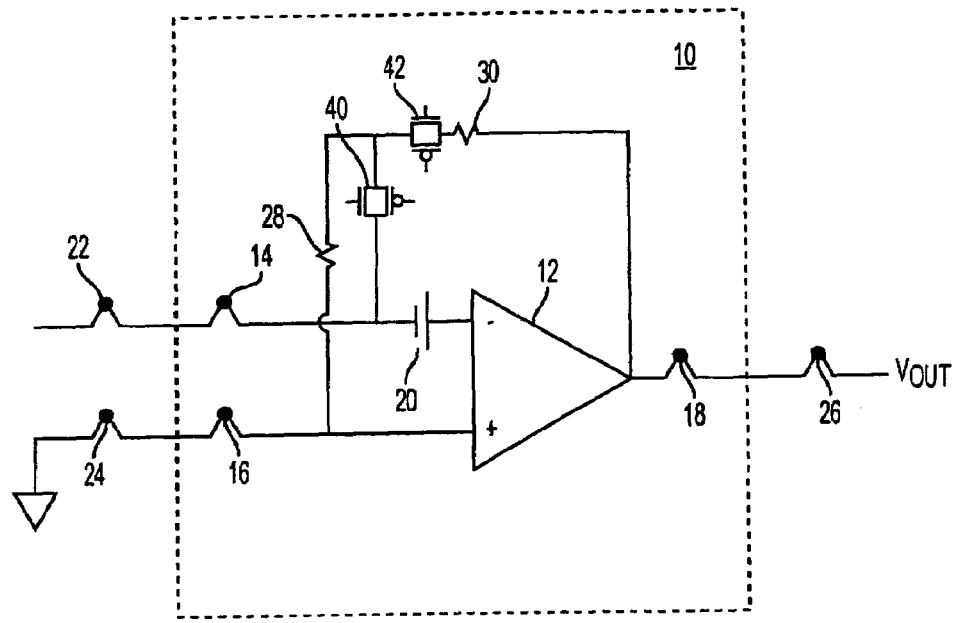
FIG. 2 is a simplified diagram of an offset measurement arrangement in accordance with the present invention.

The simplified diagram of FIG. 2 is illustrative of one approach for circumventing the thermocouple voltage generation problem. Noise gain resistors 28 and 30, with respective values represented by R and KR, and switches 40 and 42 are integrated into the integrated circuit package 10. Noise gain resistor 28 is connected at one end with the non-inverting amplifier input and at the other end with switch 40. Switch 40 is connected to the inverting amplifier input. Noise gain resistor 30 is connected at one end to the amplifier output and at the other end with switch 42. Switch 42 is connected to switch 40. While the noise gain resistors remain permanently embedded in the integrated circuit, they are connected to the operational amplifier 12 only when integrated circuit switches 40 and 42 are activated. Switches are activated to the closed state only during a calibration process to access noise gain and are disabled to the open state otherwise. Thermocouple generated voltages can be produced at input bond wire and package interface junctions 14 and 16, output bond wire and package interface junction 18, and handler junction connections 22, 24 and 26.

During the closed state of switches 40 and 42 $V_{OUT}$ can be calculated as follows:

$$V_{OUT}=(V_{OS})\cdot(1+K)+V_{16}+V_{24}+V_{18}+V_{26}.$$

Thus only the amplifier voltage offset is gained up by the noise gain factor (1+K). When K is large, $V_{OS}$ becomes the dominant contributor to $V_{OUT}$ and also makes it possible to distinguish amplifier offset from the accompanying contact thermocouple voltages, and then to proceed with adjusting for the offset voltage. The particular circuit connection of switch 40, i.e., between the inverting input of the amplifier and the node between resistor 28 and switch 42, eliminates contribution of the ON resistance of switch 40 to noise gain error.

Figure 3:
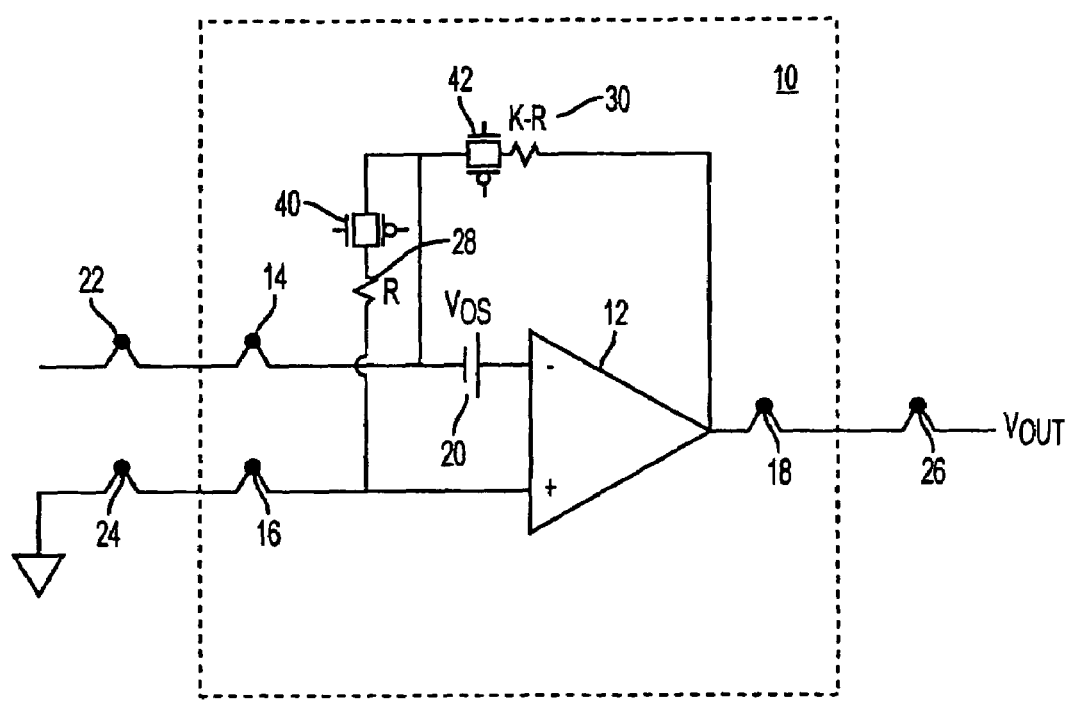
FIG. 3 is a simplified diagram of a variation of the offset measurement arrangement of FIG. 2.

FIG. 3 depicts a variation of the arrangement of FIG. 2 wherein noise gain resistor 28 is connected in series with switch 40 across both amplifier inputs and switch 42 is connected to noise gain resistor 28 through switch 40. Switch 40 can be scaled such that its W/L size is 1/K times the size of switch 2 to produce an accurate noise gain of (1+K).

Figure 4:
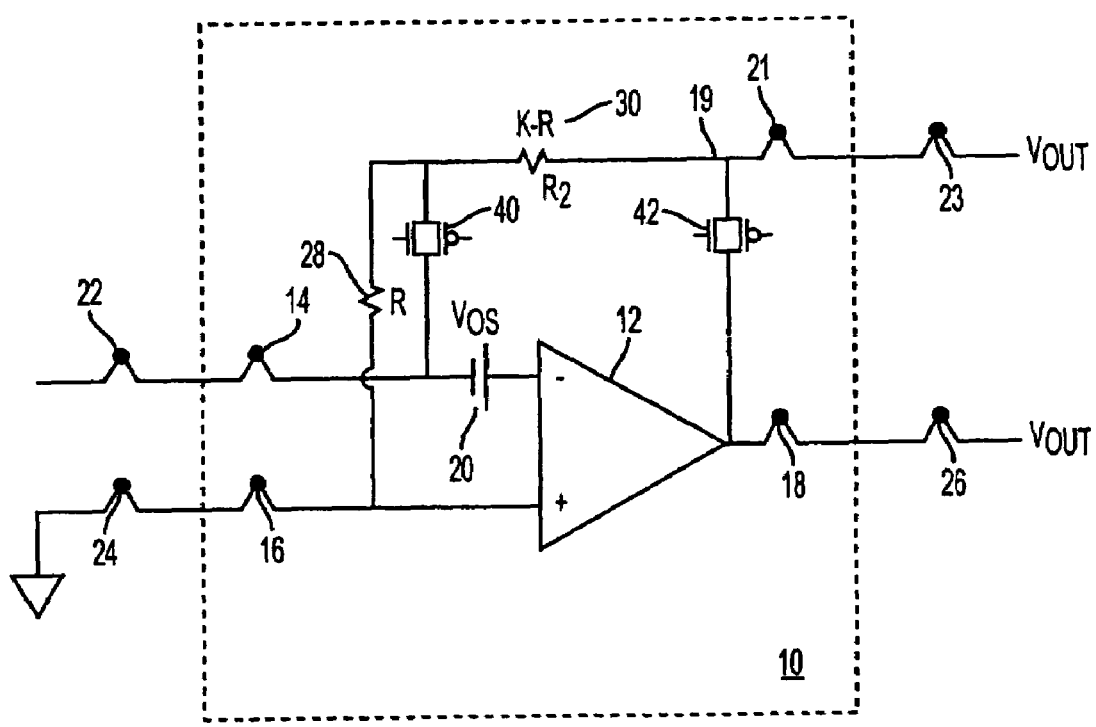
FIG. 4 is a simplified diagram of a further variation of the offset measurement arrangement of FIG. 2.

FIG. 4 depicts another variation of FIG. 2 and differs therefrom in the provision of amplifier output access from a node 19 that joins noise gain resistor 30 and switch 42. Node 19 is connected to bond wire and package interface junction 21 which, in turn, can be connected via a separate pin to the handler through junction 23. Access from node 19 occurs only during a calibration process. A more accurate noise gain can be achieved by sensing around the switch 42, thereby removing any switch 42ON resistance error to obtain a more accurate measurement of $V_{OS}$.

Figure 5:
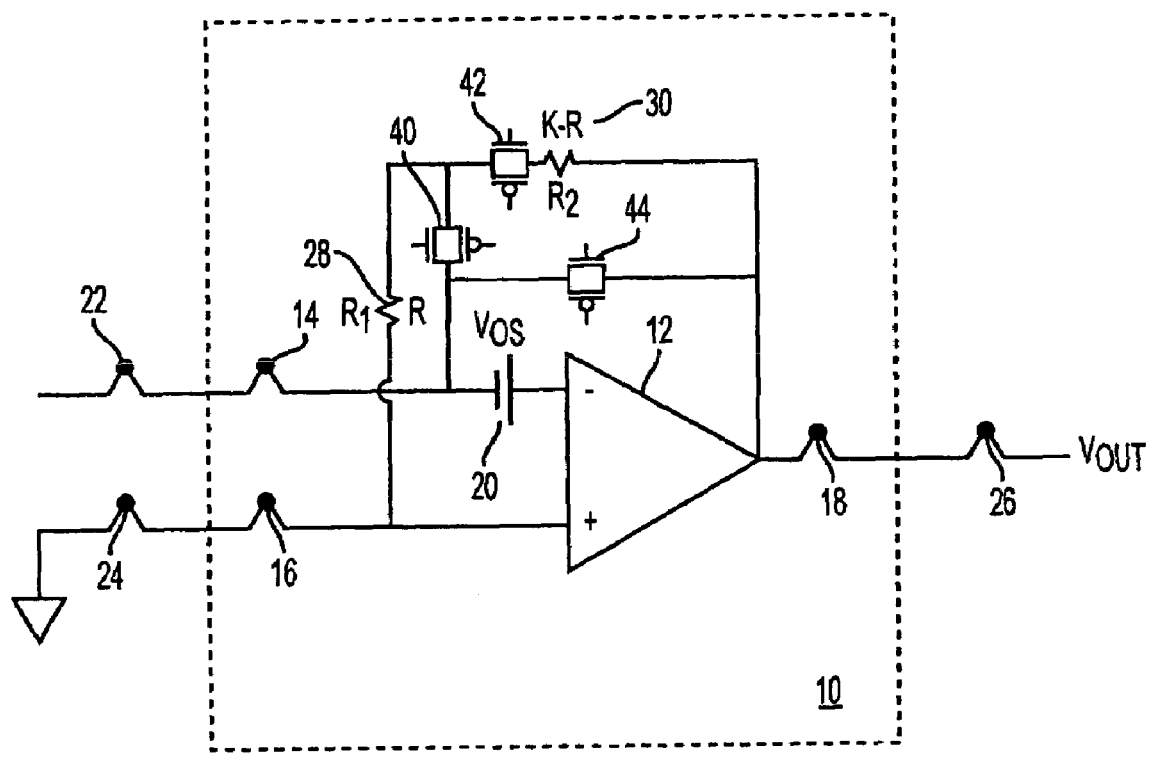
FIG. 5 is a simplified diagram of an additional variation of the offset measurement arrangement of FIG. 2.

FIG. 5 depicts another measurement arrangement. All elements of FIG. 2 are arranged in the same configuration in FIG. 5, with the addition of integrated switch 44. Switch 44 is connected between the inverting input of the amplifier and the amplifier output. Calculation of $V_{OS}$ is made after taking two $V_{OUT}$ measurements. A first measurement is taken with only switches 40 and 42 closed.

$$V_{OUT1}=(V_{OS})\cdot(1+K)+V_{16}+V_{24}+V_{18}+V_{26}$$

A second measurement is taken only with switch 44 closed.

$$V_{OUT2}=(V_{OS})+V_{16}+V_{24}+V_{18}+V_{26}$$

Subtracting the first measurement from the second measurement yields $$V_{OUT1}-V_{OUT2}=(V_{OS})\cdot K$$

Thus the offset voltage $V_{OS}$ can be obtained from these measurements completely independent of the thermocouple voltages throughout the system.

Figure 6:
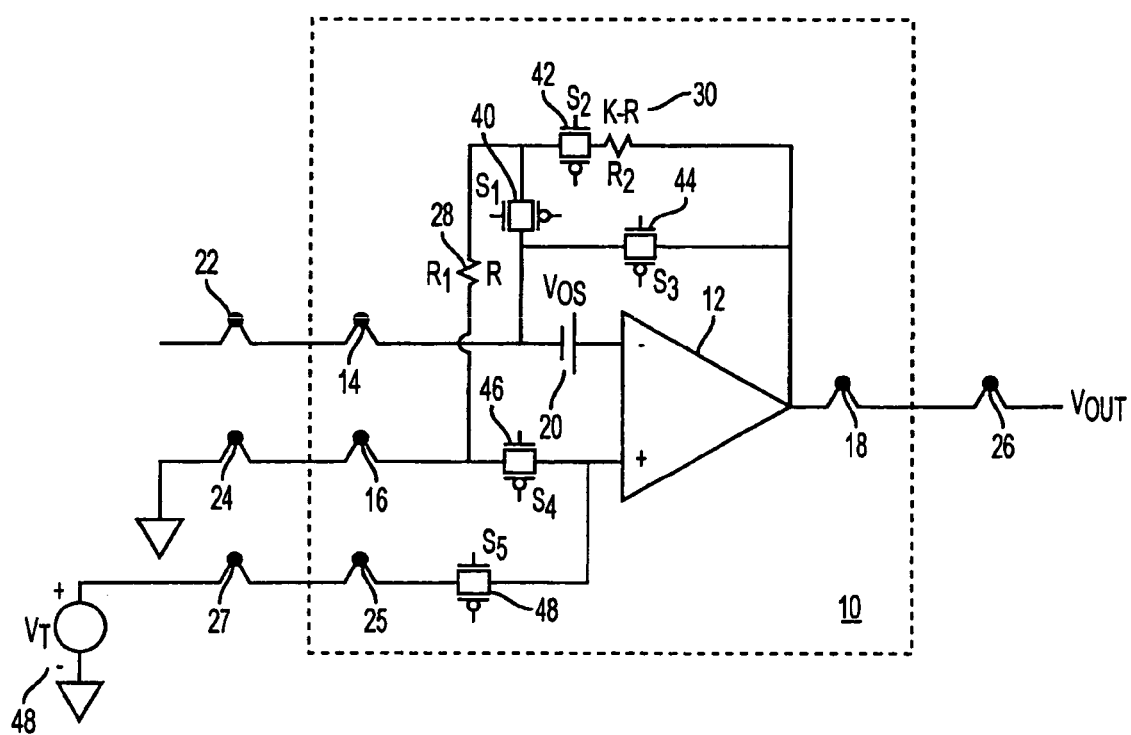
FIG. 6 is a simplified diagram of another variation of the offset measurement arrangement of FIG. 2.

FIG. 6 depicts a variation of the arrangement of FIG. 5 and differs therefrom in the following respects. An integrated circuit switch is inserted between the non-inverting input to the amplifier and the bond wire and package interface junction 16. An additional pin is provided at bond wire and package interface junction 25. Integrated switch 48 is connected between the non-inverting input of the amplifier and the bond wire and package interface junction 25. The bond wire and package interface junction 25 can be connected to the handler at junction 27.

The additional circuit provisions permit a measurement of actual noise gain before calculating voltage offset. Such measurement eliminates effects occurring from deviation of the actual noise gain factor $(1+K_{ACTUAL})$ from the ideal noise gain factor $(1+K)$. Switch 46 is always in an ON state except when the noise gain is measured. To measure the noise gain, switch 46 is set to the OFF state and switch 48 is set to the ON state. With switch 40 and 42 set to ON and switch 44 set to OFF, voltages $V_{T1}$ and $V_{T2}$ from source 48, and preferably of opposite polarity, are successively applied to the non-inverting amplifier input via switch 48. The following calculations can then be made:

$$V_{OUT1} = (V_{T1} + V_{25} + V_{27} - V_{OS}) \cdot (1 + K_{ACTUAL}) - K_{ACTUAL} \cdot (V_{24} + V_{16}) + V_{18} + V_{26}$$

$$V_{OUT2} = (V_{T2} + V_{25} + V_{27} - V_{OS}) - (1 + K_{ACTUAL}) - K_{ACTUAL} \cdot (V_{24} + V_{16}) + V_{18} + V_{26}$$

Subtraction of $V_{OUT2}$ from $V_{OUT1}$ yields the noise gain factor $(1+K_{ACTUAL})$ as a function of four measured variables:

$$V_{OUT1} - V_{OUT2} = (V_{T1} - V_{T2}) \cdot (1 + K_{ACTUAL}), \text{ or}$$

$$(1 + K_{ACTUAL}) = (V_{OUT1} - V_{OUT2})/(V_{T1} - V_{T2})$$

Further measurements can be taken as described for the arrangement of FIG. 5 for an accurate calibration process.

Figure 7:
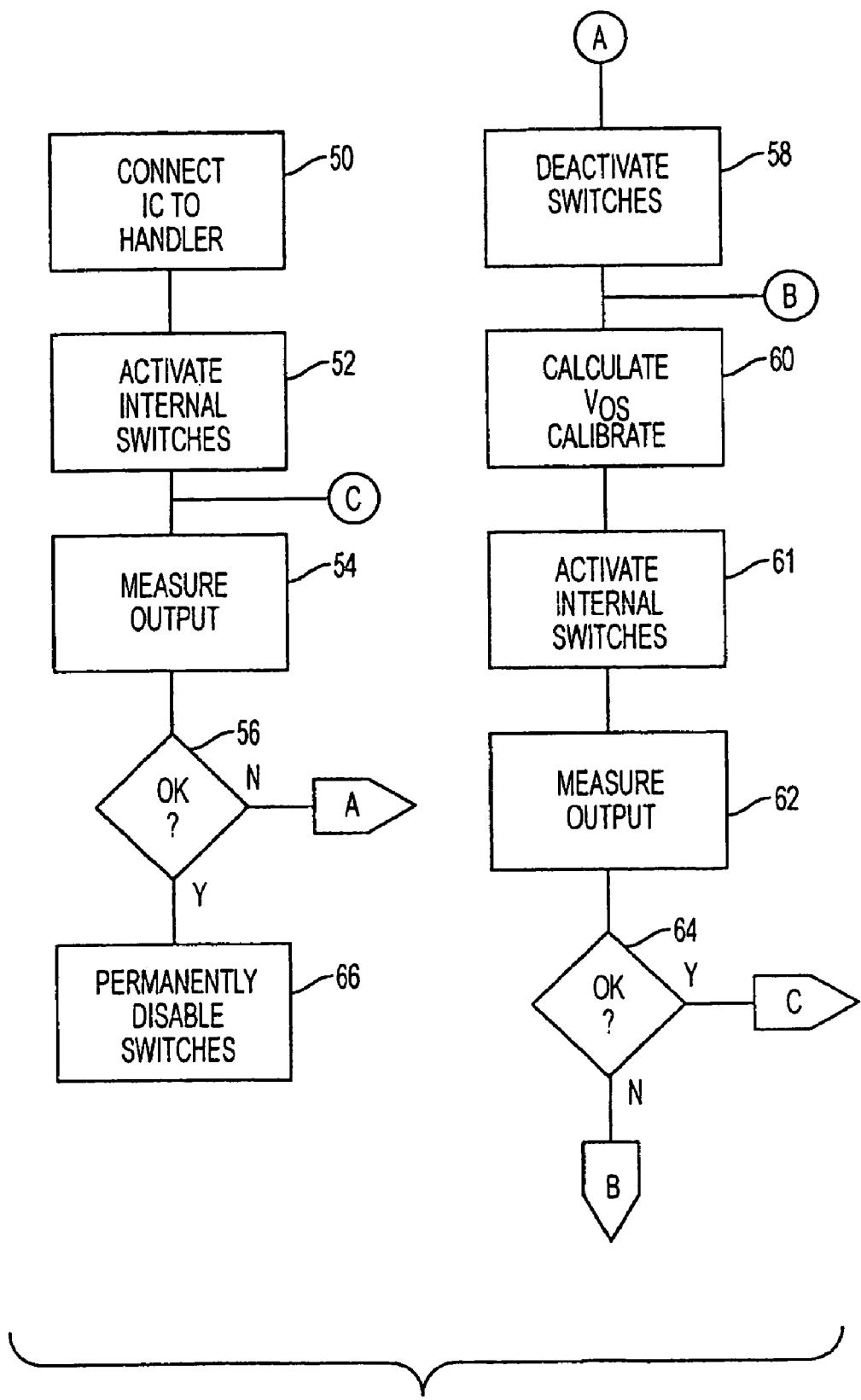
FIG. 7 is a flow chart exemplary of the operation in accordance with the present invention.

FIG. 7 is a simplified flow chart of the measurement process for the IC handler calibration device. At step 50, the handler is connected to the appropriate pins of the integrated circuit package. In the arrangement of FIGS. 2, 3 and 5, connection is made to two input pins and a single output pin. In the arrangement of FIG. 4, connection is made to two input pins and two output pins. In the arrangement of FIG. 6, connection is made to three input pins and a single output pin. Ground connection is made as shown in each figure.

At step 52, the internal integrated switches 40 and 42 are concurrently activated to the ON state and the output measured at step 54. For the arrangements of FIGS. 5 and 6, steps 52 and 54 also comprise activation of switch 44 to the ON state and output measurement, while switches 40 and 42 are inactive. In addition, in the arrangement of FIG. 6, two further measurements are made with switches 40, 42 and 48 active and switches 44 and 46 inactive. The two additional measurements are taken with voltages $V_{T1}$ or $V_{T2}$ applied to the third input pin. If an unacceptable output measurement has been determined in step 56, all internal switches are deactivated in step 58, except for switch 46 of FIG. 6, which is maintained active in the ON state.

In step 60, the amplifier voltage offset is calculated based the measurements taken in accordance with the equations specified above and the amplifier is calibrated to null the offset $V_{OS}$. Calibration may be performed in any of the conventional methods earlier described. For example, an auxiliary differential input stage, not accessible to a user, may be used to steer a small current imbalance to the same load seen by the input differential pair to counteract the effect of $V_{OS}$. The differential voltage seen by the auxiliary pair may be controlled and adjusted by a voltage digital to analog converter whose voltage output is controlled in a known, predictable way by a stable voltage reference, a binary resistor divider string, and integrated CMOS switches that select the tap in the voltage divider string as a function of the programmed digital word. The digital to analog converter may be programmed by means of a digital serial interface. The digital word controls the digital to analog converter to set the voltage at the input of the auxiliary differential pair, which steers the degree of current imbalance to the main differential input pair load.

After calibration, the internal switches again are activated in step 61 and the amplifier output is measured at step 62 to determine whether the offset $V_{OS}$ is within specified limits. If the offset does not meet specification, as determined in step 64, the process flow reverts to step 60 so that calibration adjustment is performed. For the exemplified calibration method discussed above, another digital to analog converter code can be tried until the auxiliary differential pair produces enough imbalance to null out the voltage offset. When the measured output of step 62 is found acceptable, as determined in step 64, the process reverts to step 52 to confirm this result. The internal switches again are appropriately activated and the output measured. After determination at step 56 that the output meets specification, the handler is disconnected from the integrated circuit and internal switches are permanently disabled at step 66. Switches 40, 42, 44 and 48, and integrated die resistors 28 and 30 are permanently locked out, for example, by a polysilicon fuse blowing mechanism and are made inaccessible to the user. Access to a digital to analog converter, if used for the calibration process, may be made inaccessible in a similar manner.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example the measurement process can be performed either at wafer sort or at final post package test.

What is claimed is:

1. An integrated circuit comprising:
   an operational amplifier having inverting and non-inverting input nodes and an output node;
   a first noise gain resistor; and
   a first switch connected between the noise gain resistor and one of the amplifier nodes;
   wherein the first switch is operable to a closed state during voltage offset measurement by an external device to produce an amplifier voltage offset value greater in magnitude than effects of voltages generated by circuit junction connections;
and
   the first noise gain resistor and the first switch are connected in series between the inverting and non-inverting input nodes, the first noise gain resistor directly connected to the non-inverting input node and the first switch connected to the inverting input node.

2. An integrated circuit as recited in claim 1, further comprising:
   a second noise gain resistor; and
   a second switch; wherein
   the second noise gain resistor and the second switch are connected in series between the first switch and the output node.

3. An integrated circuit as recited in claim 2, wherein the first noise gain resistor is directly connected to a junction joining the first and second switches.

4. An integrated circuit as recited in claim 2, wherein the second switch is directly connected to a junction joining the first switch and the inverting input node.

5. An integrated circuit as recited in claim 2, further comprising a node for connection to an external device, the node formed at a junction joining the second noise gain resistor and the second switch.

6. An integrated circuit comprising:
an operational amplifier having inverting and non-inverting input nodes and an output node;
a first noise gain resistor;
a first switch, the first noise gain resistor and the first switch connected in series between the inverting and non-inverting input nodes, the first noise gain resistor connected to the non-inverting input node and the first switch connected to the inverting input node;
a second noise gain resistor;
a second switch, the second noise gain resistor and the second switch connected in series between the first switch and the output node, the second switch directly connected to a junction joining the first switch and the inverting input node; and
a third switch connected between the inverting input node and the output node;
wherein the first switch is operable to a closed state during voltage offset measurement by an external device to produce an amplifier voltage offset value greater in magnitude than effects of voltages generated by circuit junction connections.

7. An integrated circuit as recited in claim 6, further comprising a fourth switch in circuit between the non-inverting input node and the first noise gain resistor and a fifth switch connected to a junction joining the non-inverting input node and the fourth switch;
wherein the non-inverting input node may be connected to a voltage source through either the fourth switch or the fifth switch.

8. A method for calibration of an integrated circuit amplifier used in high volume test environments, the method comprising the steps of:
establishing circuit connections between the integrated circuit and an external device;
connecting noise gain resistance formed within the integrated circuit to the amplifier;
measuring the value of output voltage of the amplifier while the noise gain resistance remains connected;
obtaining a voltage offset based on the voltage value obtained in the measuring step;
differentiating the voltage offset from parasitic thermal voltages to calibrate a zero voltage offset; and
disconnecting the connections made in the establishing step.

9. A method as recited in claim 8, wherein the step of connecting comprises activating a switch within the integrated circuit to a closed state.

10. A method as recited in claim 8, further comprising the step of permanently disconnecting the noise gain resistor from the amplifier for subsequent amplifier operation.

11. A method as recited in claim 8, wherein the step of measuring comprises sensing an output voltage of the amplifier taken at a junction point between the second switch and the resistance of the second value.

12. A method as recited in claim 8, wherein in the amplifier is an operational amplifier having inverting and non-inverting input nodes and an output node, and the step of connecting comprises the steps of:
activating a first switch within the integrated circuit to connect resistance of a first value between the inverting and non-inverting input nodes; and
activating a second switch within the integrated circuit to connect resistance of a second value between the inverting input node and the output node.

13. A method as recited in claim 8, further comprising the step of permanently deactivating the first and second switches after the step of calibrating.

14. A method for calibration of an integrated circuit amplifier, the method comprising the steps of:
establishing circuit connections between the integrated circuit and an external device;
connecting noise gain resistance formed within the integrated circuit to the amplifier;
measuring the value of output voltage of the amplifier while the noise gain resistance remains connected;
calibrating the amplifier to obtain a zero voltage offset based on the voltage value obtained in the measuring step; and
disconnecting the connections made in the establishing step; wherein the step of connecting comprises the steps of:
activating a first switch within the integrated circuit to connect resistance of a first value between the inverting and non-inverting input nodes; and
activating a second switch within the integrated circuit to connect resistance of a second value between the inverting input node and the output node; and
further comprising the steps of:
deactivating the first and second switches;
activating a third switch within the integrated circuit to connect the inverting input node to the output node; and
measuring the value of output voltage of the amplifier while the first and second switches are deactivated and the third switch is activated.

15. A method as recited in claim 14, wherein the calibrating step comprises subtracting the measured output voltage value when the first and second switches are activated from the measured output voltage value when the third switch is activated to obtain a measurement of the voltage offset value of the amplifier.

16. A method for calibration of an integrated circuit amplifier, the method comprising the steps of:
establishing circuit connections between the integrated circuit and an external device;
connecting noise gain resistance formed within the integrated circuit to the amplifier;
measuring the value of output voltage of the amplifier while the noise gain resistance remains connected;
calibrating the amplifier to obtain a zero voltage offset based on the voltage value obtained in the measuring step; and
disconnecting the connections made in the establishing step; wherein the step of connecting comprises the steps of:
activating a first switch within the integrated circuit to connect resistance of a first value between the inverting and non-inverting input nodes; and
activating a second switch within the integrated circuit to connect resistance of a second value between the inverting input node and the output node;

wherein said measuring step comprises the steps of:
sensing the amplifier voltage output when the non-inverting input of the amplifier is connected to ground; and
sensing the amplifier voltage output when the non-inverting input of the amplifier is connected to a voltage of a first polarity.

17. A method as recited in claim 16, wherein said measuring step further comprises sensing the amplifier voltage output when the non-inverting input of the amplifier is connected to a voltage of second polarity.

* * * * *